(12) United States Patent
Lewis

(10) Patent No.: US 6,489,853 B1
(45) Date of Patent: Dec. 3, 2002

(54) LOW PHASE NOISE OSCILLATOR

(75) Inventor: Charles Lewis, San Diego, CA (US)

(73) Assignee: Z-Communications, Inc., San Diego, CA (US)

( * ) Notice: Subject to any disclaimer, the term of this patent is extended or adjusted under 35 U.S.C. 154(b) by 0 days.

(21) Appl. No.: 09/742,958

(22) Filed: Mar. 19, 2002

(51) Int. Cl.$^7$ .............................. H03B 5/12; H03B 5/18
(52) U.S. Cl. ................. 331/117 R; 331/36 C; 331/96; 331/117 D; 331/175; 331/177 V
(58) Field of Search ................. 331/36 C, 96, 331/99, 100, 117 R, 117 FE, 117 D, 175, 177 V

(56) References Cited

U.S. PATENT DOCUMENTS

| | | | |
|---|---|---|---|
| 3,855,553 A | 12/1974 | Cronin | 331/117 |
| 4,146,850 A | 3/1979 | Fache et al. | 331/117 |
| 4,564,822 A | 1/1986 | Saitoh et al. | 331/117 |
| 4,580,109 A | 4/1986 | Lockwood | 331/117 |
| 4,758,808 A | 7/1988 | Sasaki et al. | 333/185 |
| 5,097,228 A * | 3/1992 | McJunkin | 331/176 |
| 5,166,647 A | 11/1992 | Riebman | 33/107 |
| 5,337,014 A | 8/1994 | Najle et al. | 324/613 |
| 5,341,110 A | 8/1994 | Nardi | 331/17 |
| 5,351,014 A | 9/1994 | Ichiyoshi | 331/1 |
| 5,373,264 A | 12/1994 | Higgins, Jr. | 331/117 |
| 5,374,902 A | 12/1994 | Bradley | 331/2 |
| 5,572,180 A | 11/1996 | Huang et al. | 336/200 |
| 5,612,660 A | 3/1997 | Takimoto | 336/200 |
| 5,978,231 A | 11/1999 | Tohya et al. | 361/782 |
| 6,002,593 A | 12/1999 | Tohya et al. | 361/765 |
| 6,013,939 A | 1/2000 | El-Sharawy | 257/531 |
| 6,114,936 A | 9/2000 | Yamamoto et al. | 336/192 |

* cited by examiner

Primary Examiner—David C. Mis
(74) Attorney, Agent, or Firm—Gipple & Hale

(57) ABSTRACT

An oscillator is described which exhibits low phase noise characteristics. The oscillator circuit of the invention includes an inductor in series with a low value capacitor, this series combination of an inductor and a capacitor, in parallel with a low value inductor forms a resonator whose inductive and capacitive reactances are a very low value. This causes the loaded Q to be very close to the resonator's unloaded Q.

23 Claims, 19 Drawing Sheets

LOW PHASE NOISE OSCILLATOR

BACKGROUND OF THE INVENTION

1. Field of the Invention

This invention relates to low cost, low phase noise oscillators. The oscillator of this invention is designed to be used in many applications where low phase noise is a main design consideration.

2. Description of Related Art

There are many oscillating circuits available for use at high frequencies and each has certain performance limitations. The well known Colpitts oscillator works well up to about 1 Ghz. Above 1 Ghz the configuration generally referred to as the standard microwave oscillator is used and works very well as a low cost, medium phase noise voltage controlled oscillator. The standard configuration does not exhibit good phase noise performance, even with a high Q resonator.

A low phase noise oscillator for operation at frequencies between 400 MHz and 6 Ghz is disclosed in U.S. Pat. No. 5,748,051 to Lewis, the substance of which is in corporated herein by reference in its entirety. Other high frequency oscillators include a modulated transistor oscillator disclosed in U.S. Pat. No. 3,855,553 to Cronin, a television tuner oscillator with feedback for more low frequency power disclosed in U.S. Pat. No. 4,564,822 to Saitoh et al., a low noise oscillator disclosed in U.S. Pat. No. 4,580,109 to Lockwood, a varactor voltage-controlled UHF oscillator Disclosed in a German Patent Number 28 11 080 A modified Clapp oscillator is disclosed in British Patent 11,114,023 to Michalek.

Other circuits dealing with phase noise problems include a negative resistance oscillator with electronically tunable base inductance described in U.S. Pat. No. 5,373,264 to Higgins Jr., a low noise oscillator which suppresses phase noise caused by internal noise of the oscillator disclosed generally in U.S. Pat. No. 5,337,014 to Najle et al. for a circuit for phase noise measurements in U.S. Pat. No. 5,341,110 to Nardi for a low phase noise reference oscillator, and in U.S. Pat. No. 5,374,902 to Bradley for an ultra low phase noise microwave synthesizer.

SUMMARY OF THE INVENTION

The present invention is concerned with an oscillator circuit for use in UHF and microwave applications which require the generation of low phase noise signals. More specifically, the present invention is directed to an oscillator circuit which includes a band pass filter having an inductor in series with a low value capacitor. This series combination of an inductor and a capacitor, in parallel with a low value inductor forms a resonator whose inductive and capacitive reactances are a very low value. This causes the loaded Q to be very close to the resonator's unloaded Q, thereby resulting in significantly reduced phase noise.

In accordance with the invention, the phase shift of the band pass filter network is the negative of the phase shift of the circuit's transistor so as to make the overall phase shift equal to zero at the oscillation frequency. The insertion loss of the band pass filter is small enough as to make the overall gain greater than unity.

A goal of this invention is to minimize the oscillator's phase noise, which depends on the loaded Q of the circuit. The subject low phase noise oscillator is superior to the UHF and microwave oscillators presently in use because this circuit takes better advantage of the resonator's Q.

DETAILED DESCRIPTION OF THE INVENTION

The present invention is directed to an oscillator circuit exhibiting low phase noise characteristics and containing a parallel resonant circuit having very low inductive and capacitive reactances.

Reference will now be made in detail to the present preferred embodiments of the invention, examples of which are illustrated in the accompanying drawings.

Preferred embodiments and best mode of the present invention are shown in FIGS. 1 through 12.

Figure 1:
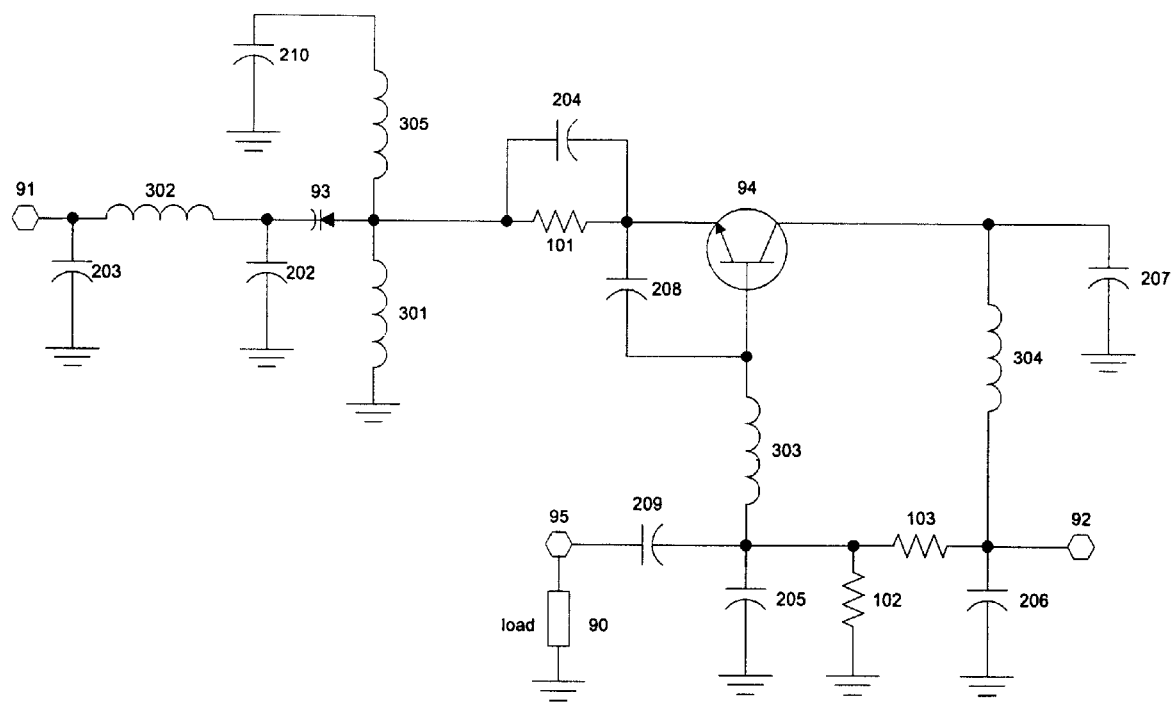
FIG. 1 schematically illustrates one embodiment of the invention as a voltage controlled oscillator.

The low phase noise oscillator illustrated in FIG. 1 is an NPN bipolar transistor 94 with capacitor 208 connected between the emitter and the base. The collector is connected to a capacitor 207 which is in turn connected to a common potential. One terminal of inductor 304 is connected through capacitor 206 to a common potential. A terminal 92, which supplies the oscillator with D.C. bias voltage, is connected on one side to the junction formed by inductor 304 and capacitor 206 and on the other side resistor 103 is connected through a biasing resistor 102 to a common potential. Capacitor 209 is connected from the junction formed by resistors 102 and 103 and capacitor 205 to the load 90. The designation "load" can refer to the circuit that receives and utilizes the low phase noise oscillating signal. Alternatively, capacitor 209 and load 90, can as shown in FIGS. 7, 8, 9, 10, 11 and 12 can be connected at the junction of inductor 304 and capacitor 207. Inductor 303 is connected on one side to the base of transistor 94 and on the other side to the junction formed by the terminals of capacitors 209 and resistors 102 and 103.

One terminal of capacitor 210 is grounded, the other terminal of 210 is connected to ground through inductor 301.

Capacitor 204 and resistor 101 are connected in parallel; one side of this parallel pair is connected to the junction formed by the emitter and capacitor 208 and the other side of the parallel pair 204 and 101 is connected to the junction formed by inductors 305 and 301.

The anode terminal of varactor 93 is connected to the junction formed by capacitor 204, resistor 101, inductor 305 and inductor 301. The cathode terminal of varactor 93 is connected through inductor 302 to capacitor 203 which is in turn connected to a common potential.

As shown in FIGS. 1, 3, 5, 7, 9 and 11 a capacitor 202 can be connected on one side to the junction formed by a varactor 93 and inductor 302 on the other side to a common potential. A terminal for varactor control voltage is connected to the junction between inductor 302 and capacitor 203. In operation, the biasing of transistor 94, i.e., the establishment of the D.C. collector current and collector to emitter voltage, is accomplished through the biasing resistors 101, 102 and 103 and the application of a D.C. voltage which is done through the D.C. supply terminal 92. Transistor 94 is based to operate in the linear region, but is pushed into Class C mode by the oscillating signal. Capacitors 203, 204, 205 and 206 are radio frequency (RF) by pass capacitors are chosen so that these circuit elements act as short circuits to the A.C. signal voltages in the circuit. Inductor 304 also provides D.C. bias current to the collector of transistor 94. Inductor 302 provides D.C. bias voltage to varactor 93.

Figure 3:
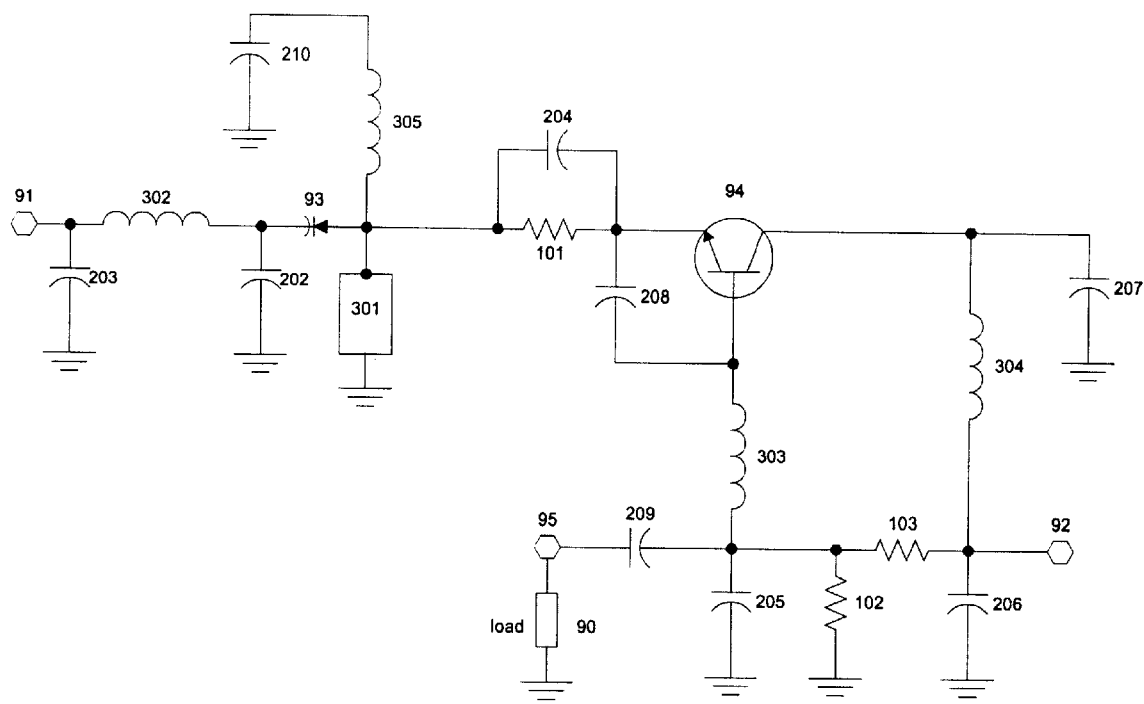
FIG. 3 illustrates an embodiment of the invention of FIG. 1 where an inductor is replaced by a microcircuit strip.
Figure 5:
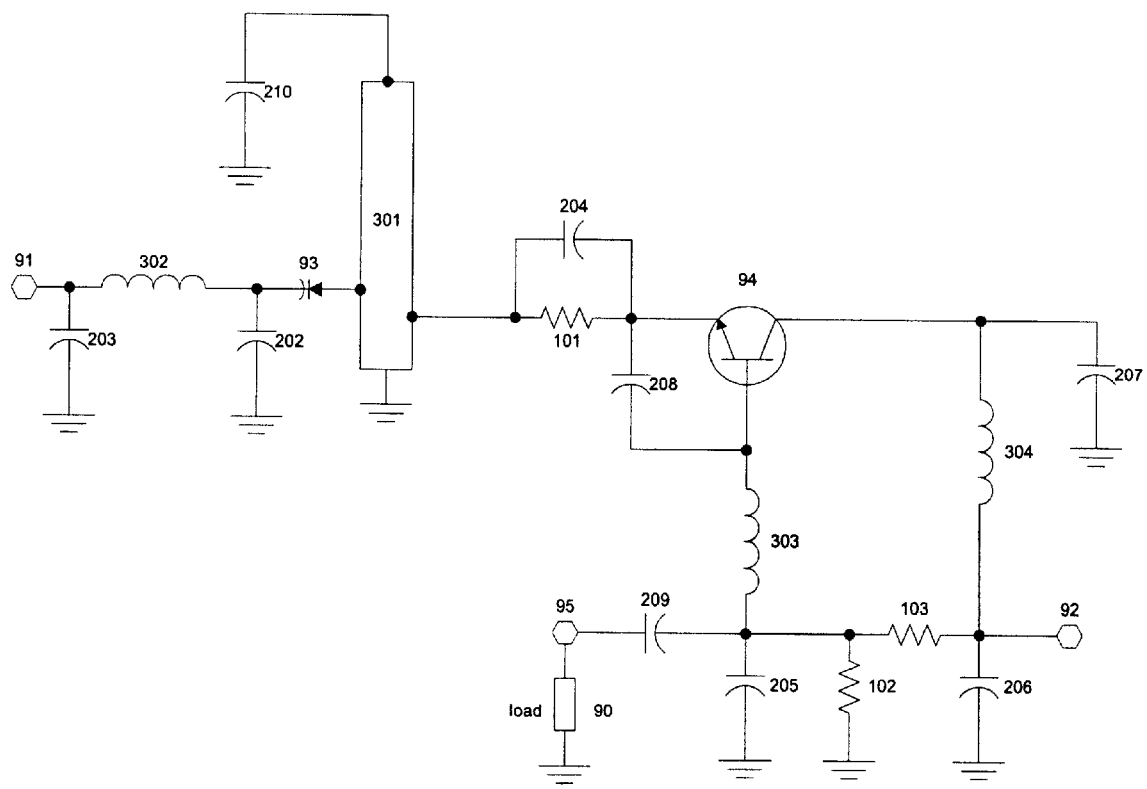
FIG. 5 illustrates the embodiment of FIG. 1 where two inductors are replaced by microstrips.
Figure 6:
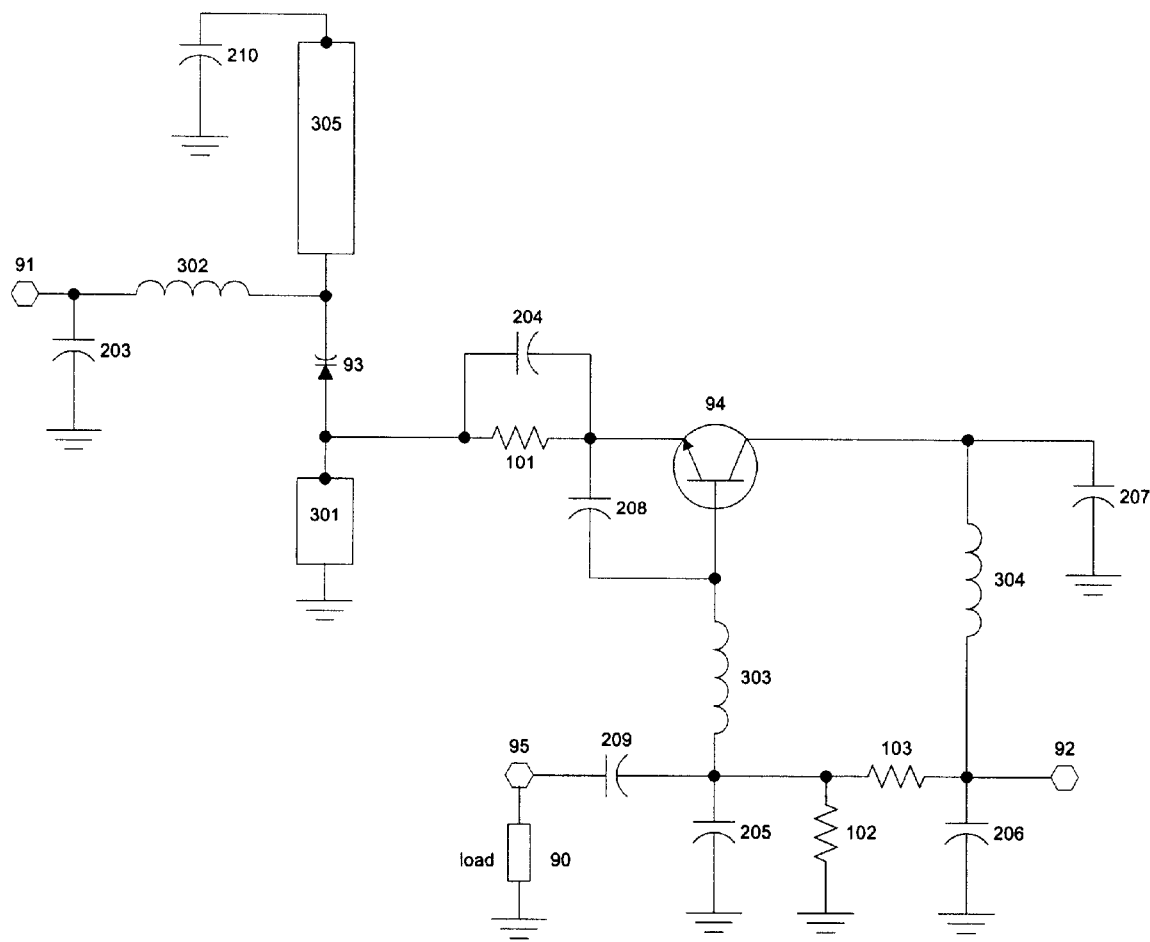
FIG. 6 illustrates the embodiment of FIG. 2 where two inductors are replaced by microstrips.

Inductors 301 and 305 and capacitor 210 form a parallel resonant circuit. Inductor 301 is a very low value inductor, typically less than one nanohenry, and as shown in FIGS. 3, 4, 5, 6, 9, 10, 11 and 12, can be a microstrip printed circuit inductor. In FIG. 3, one end of microstrip 30, is connected to a common ground and the other end is connected to the junction formed by capacitor 204, resistor 101, inductor 305 and the anode of varactor 93. In FIG. 5, one end of microstrip 301 is connected to a common. The tap closer to the grounded end is connected to the junction formed by capacitor 204 and resistor 101. The other trap is connected to the anode of varactor 93. Similarly, as shown in FIG. 6 and 12, inductor 305 can also be a microstrip printed circuit inductor. The open loop gain must be greater than unity and two, the phase of the open loop gain must be zero.

Figure 13:
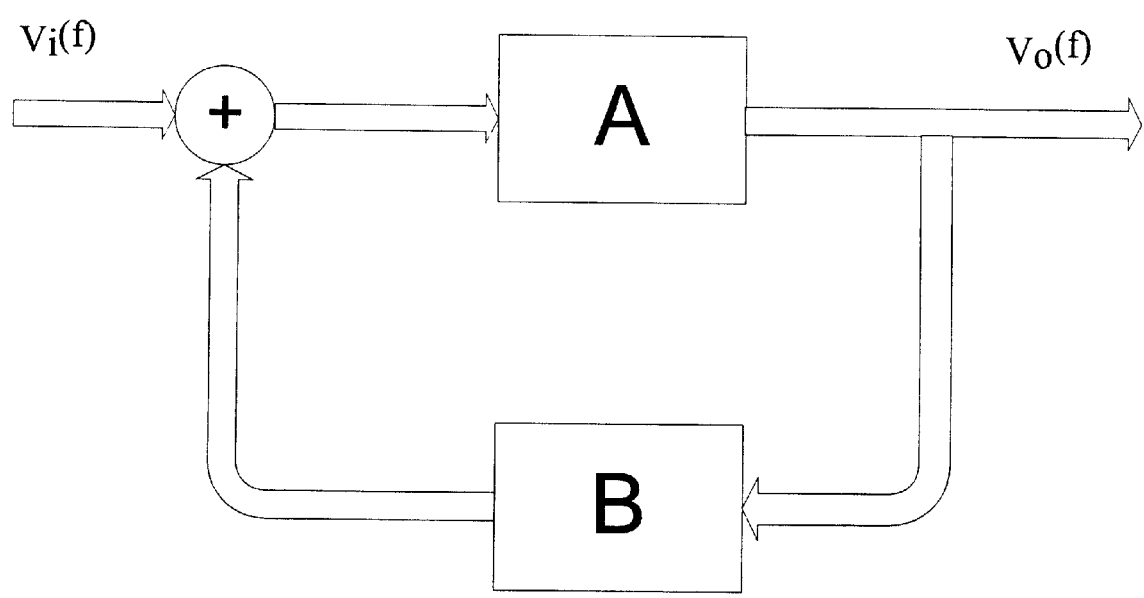
FIG. 13 is a block diagram of the oscillator of the invention.
Figure 14:
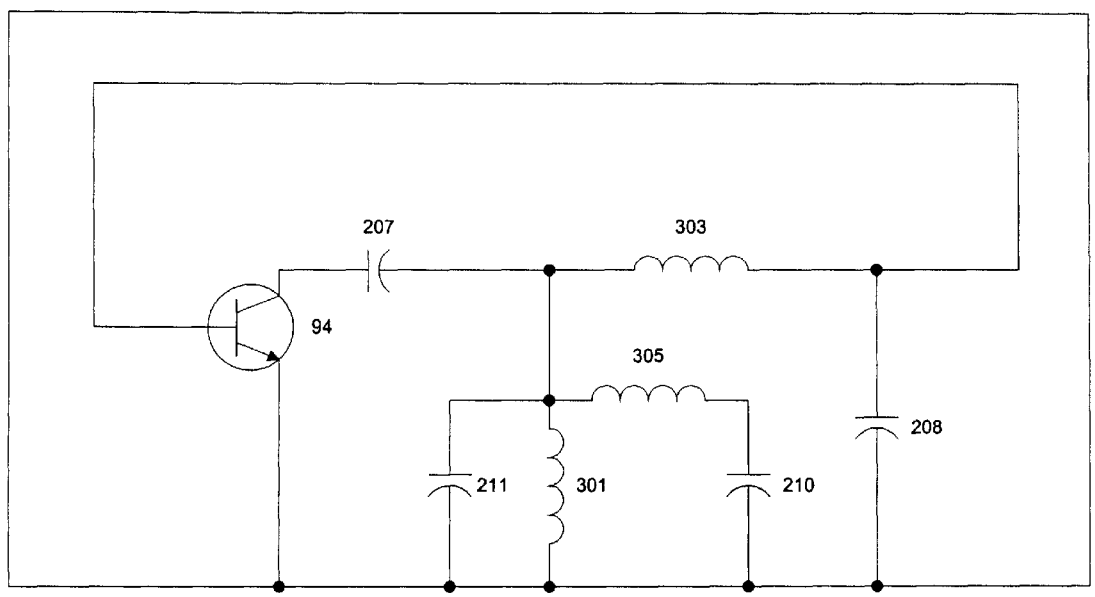
FIG. 14 is a schematic drawing illustrating the oscillator circuit of the invention without the biasing components, and as a closed loop feedback circuit.
Figure 15:
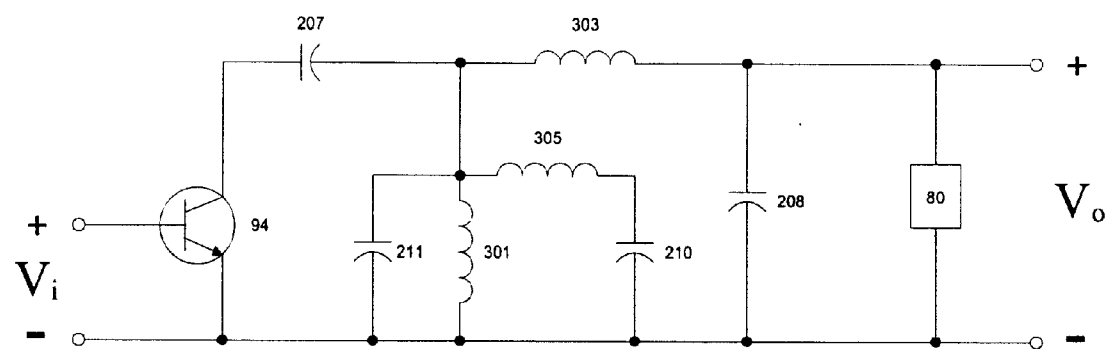
FIG. 15 is a schematic drawing illustrating the open loop configuration of the oscillator circuit of the invention without biasing components.

The circuit illustrated in FIG. 1 can be viewed as a positive feedback system of the type represented in FIG. 13. When this circuit is analyzed at RF frequencies, bypass capacitators can be considered short circuits and RF choke can be considered open circuits. The resulting circuit has the configuration shown in FIG. 14. In this equivalent circuit, capacitator 211 represents the equivalent capicitance of the series combination of capacitator 202 and varactor 93 of FIG. 1. The oscillator of FIG. 1 can be viewed as a network the output of which is connected to its input as shown on FIG. 14. The open loop gain of the oscillator is the gain of the network shown on FIG. 15. Element 80 represents the input impedance of the transistor and is well determined.

The design goal of this invention is to minimize the oscillator's phase noise. Phase noise is related to the loaded Q of the circuitry by the following equation, equation 1:

$$L(f) = \frac{KTF}{P_{AVS}} \cdot \left[1 + \left(\frac{\frac{f_0}{2Q_L}}{f}\right)^2\right]$$

Where:
K: Boltzman's constant
T: Temperature in degrees Kelvin
Pavs: Power available from the source driving the active device, which is actually the power available from the output of the device minus the losses in the feedback network.
f: Offset from oscillation frequency in Hertz.
$Q_L$ Loaded Q
F: Noise Figure of the active device
$f_0$: Oscillation frequency in Hertz
L(f) is the ratio of the phase noise power integrated over a 1 Hertz bandwidth to signal power. L(f) has dimensions of $H_z^{-1}$ and is usually expressed in dB/Hz. It is important to notice that phase noise is minimized by maximizing the loaded Q, $Q_L$.

Figure 2:
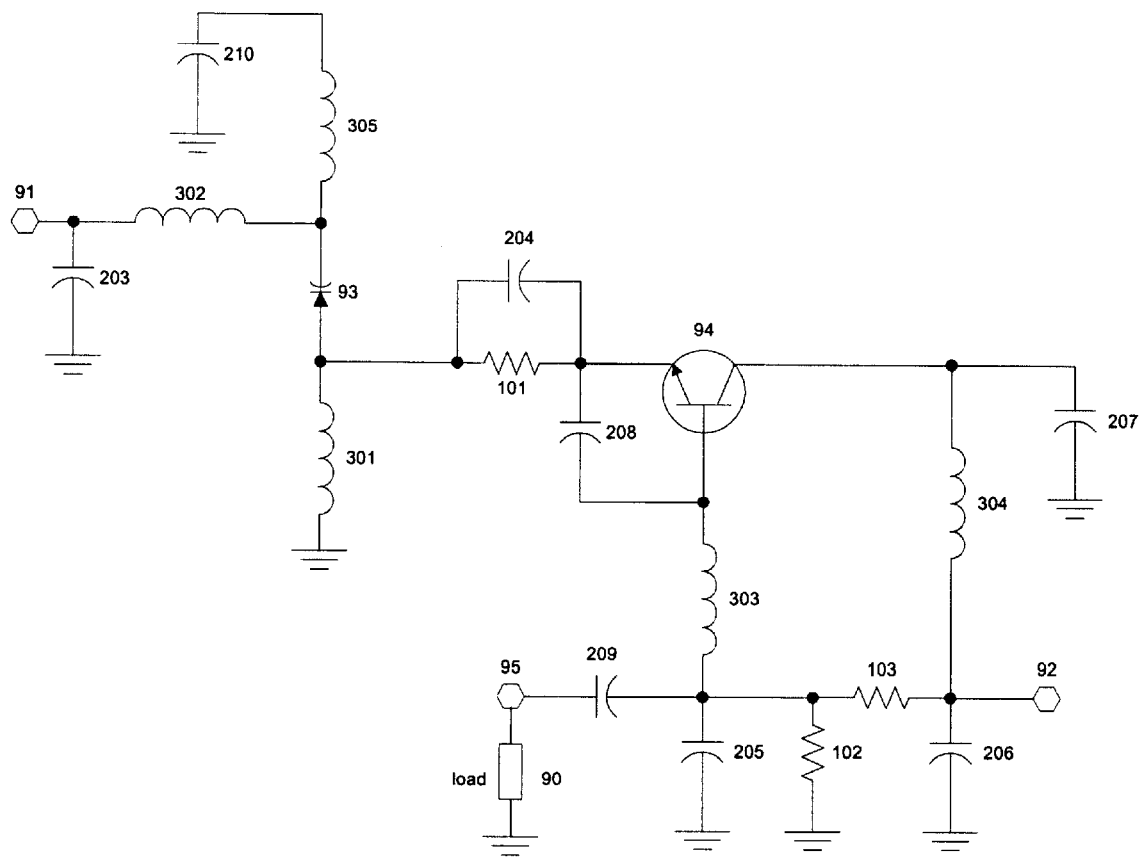
FIG. 2 illustrates schematically a second embodiment of the invention as a voltage controlled oscillator.

FIG. 2 is an embodiment of the invention as a voltage controlled oscillator or VCO. This embodiment is used when wider tunning bandwidth and reasonably low phase noise is desired. In this embodiment a large capacitance varactor 93 is in series with the equivalent capacitance of the series connection of inductor 305 and capacitor 210. The equivalent capacitance is a large value. In the case where the varactor's capacitance is much smaller than the equivalent capacitance of Inductor 305 and capacitor 210, the overall capacitance of the circuit is largely determined by the relatively low Q varactor 93, thus the phase noise is the highest value and tunning bandwidth is the widest. Practical varactors result in circuits that fall in between the above two cases, resulting on phase noise values somewhat higher than those of the circuit of FIG. 1 and frequency bandwidths wider than those of the circuit of FIG. 1.

FIG. 3 is an embodiment of the invention showing a circuit essentially identical to that of FIG. 1. The difference is that the inductor 301 of FIG. 1 has been replaced with microstrip 301 of FIG. 3. A microstrip is a long narrow rectangle printed on a printed circuit board and functions as an inductor. The advantage of using a microstrip is the cost savings associated with not using a coil inductor.

Figure 4:
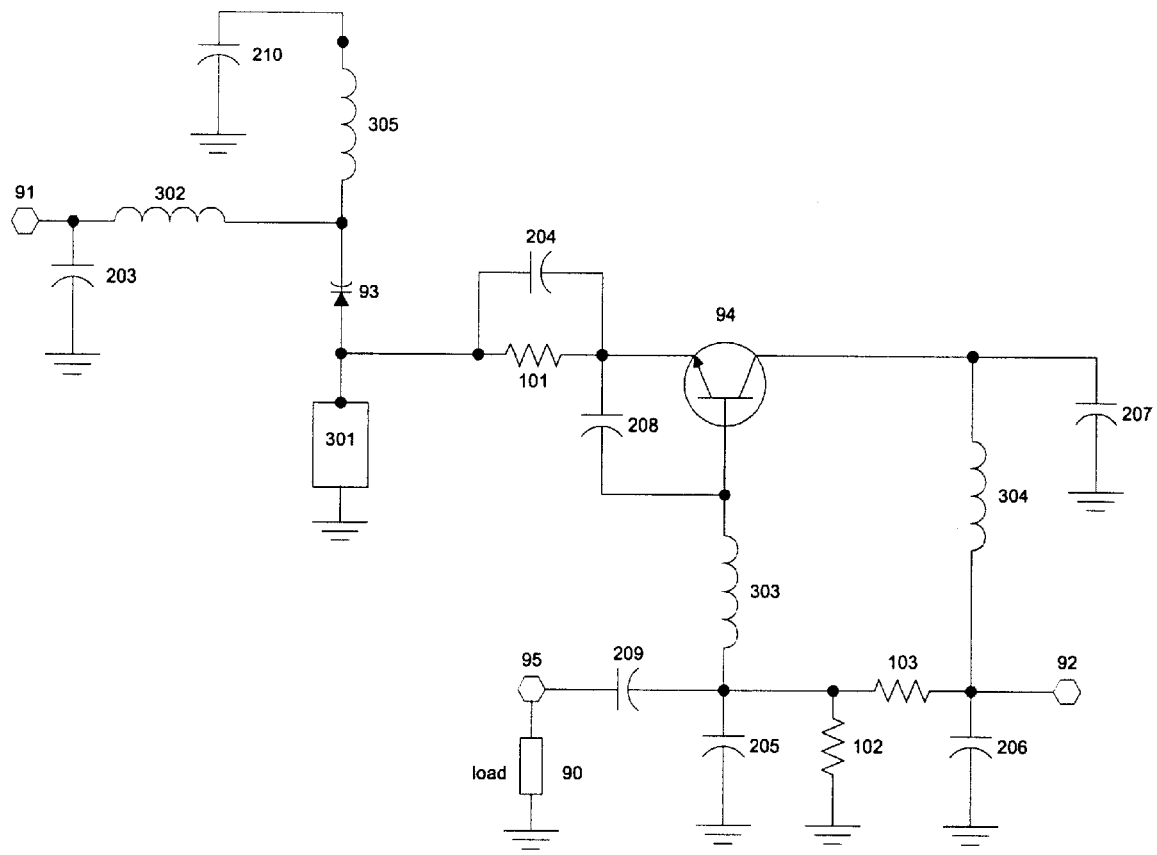
FIG. 4 illustrates the embodiment of FIG. 2 where an inductor is replaced by a microcircuit strip.

FIG. 4 is an embodiment of the invention showing a circuit essentially identical to that of FIG. 2. The difference is that the inductor 301 of FIG. 2 has been replaced with microstrip 301 of FIG. 4.

FIG. 5 is an embodiment of the invention showing a circuit essentially identical to that of FIG. 1. The differences are:

1. Inductor 301 of FIG. 1 has been replaced with the segment of microstrip 301 of FIG. 5 located between the anode of varactor 93 and ground.
2. Inductor 305 of FIG. 1 has been replaced with the segment of microstrip 301 of FIG. 5 located between the anode of varactor 93 and capacitor 210.

FIG. 5 is an embodiment of the invention showing a circuit essentially identical to that of FIG. 2. The differences are:

1. Inductor 301 of FIG. 2 has been replaced with microstrip 301 of FIG. 6.
2. Inductor 305 of FIG. 2 has been replaced with microstrip 305 of FIG. 6.

Figure 7:
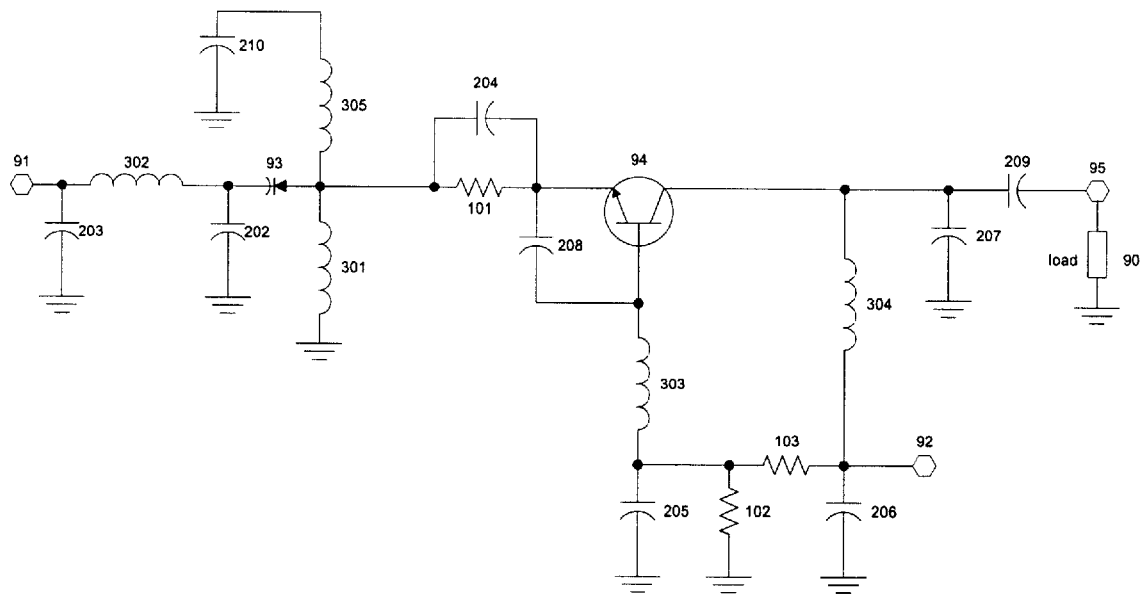
FIG. 7 illustrates the embodiment of FIG. 1 with the load connected at a different position in the circuit.

FIG. 7 is an embodiment of the invention showing an embodiment used when a higher power output and good phase noise is desired. This circuit is essentially identical to that of FIG. 1. The difference is that in the circuit of FIG. 1 the load is connected through bypass capacitor 209 to the junction of capacitor 205, resistors 102 and 103, and inductor 303; whereas in the circuit of FIG. 7 the load is connected to the junction of the collector, inductor 304 and capacitor 207.

Figure 16:
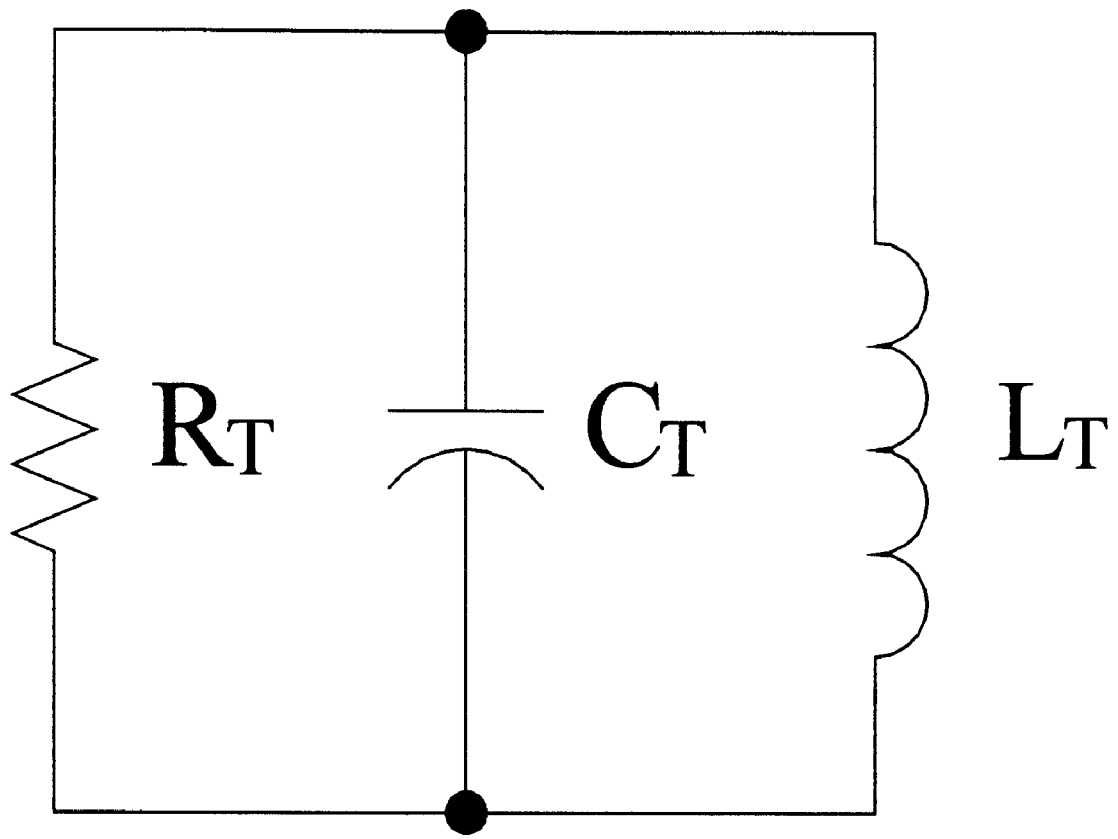
FIG. 16 is a schematic drawing of a parallel resonant circuit reduced to three components.

In the circuit of FIG. 1, the output signal is the voltage across capacitor 205 which is a decoupling capacitor. Therefore, the output signal level is very low and the load does not affect the Q of the circuit, having, thus no effect on phase noise. In the circuit of FIG. 7, the output signal is the voltage at the collector which is a relatively high value. The load is connected in parallel with capacitor 207 through bypass capacitor 209. Capacitor 207 in series with the output impedance of transistor 94 is connected in parallel with the tank circuit as illustrated in FIG. 16. Therefore the Q of capacitor 207 affects the overall Q of the oscillator. Since the circuit of FIG. 7 the load is in parallel with capacitor 209 the Q of this parallel combination is low and the overall Q of the circuit is somewhat reduced. This results in phase noise values that while relatively low, are not as low as those of the circuit of FIG. 1.

Figure 8:
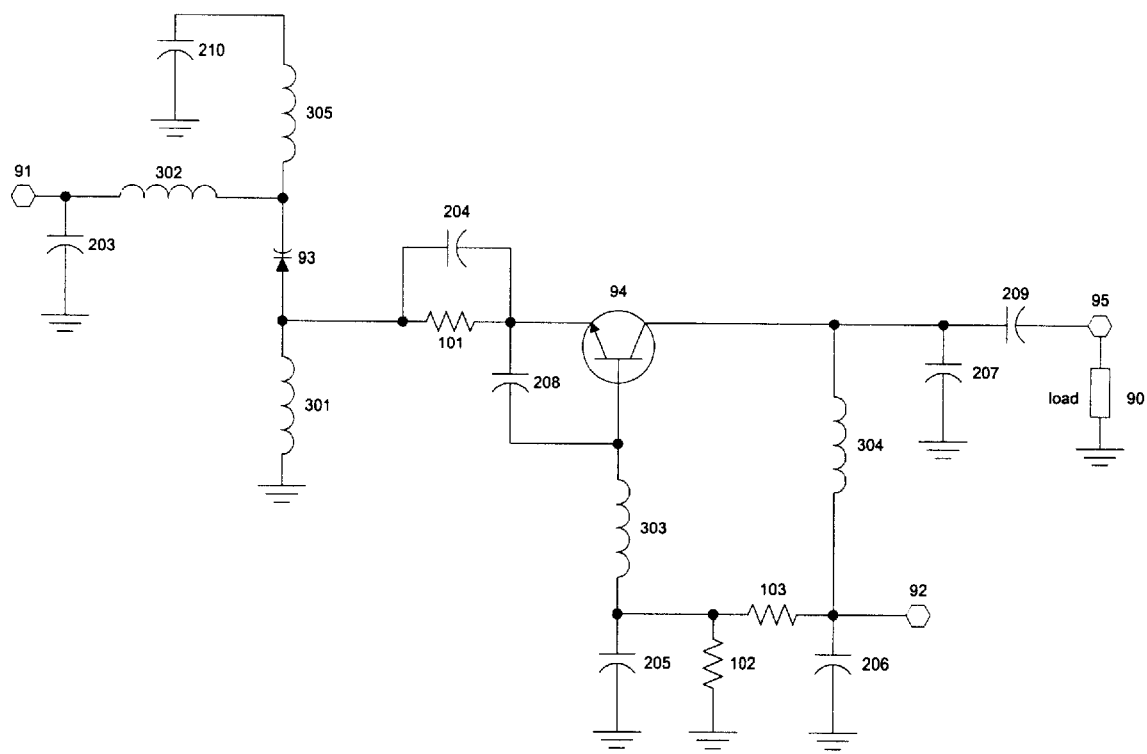
FIG. 8 illustrates the embodiment of FIG. 2 with the load connected at a different position in the circuit.

FIG. 8 is an embodiment of the invention used when a higher power output and good phase noise is desired. This circuit is essentially identical to that of FIG. 2. The difference is that in the circuit of FIG. 2 the load is connected through bypass capacitor 209 to the junction of capacitor 205, resistors 102, and 103, and inductor 303; whereas in the circuit of FIG. 8 the load is connected to the junction of the collector, inductor 304 and capacitor 207. In the circuit of FIG. 2, the output signal is the voltage across capacitor 205 which is a decoupling capacitor. Therefore, the output signal level is very low and the load does not affect the Q of the circuit, having, thus no effect on phase noise. In the circuit of FIG. 8, the output signal is the voltage at the collector which is a relatively high value. The load is connected in parallel with capacitor 207 through bypass capacitor 209. Capacitor 207 in series with the output impedance of transistor 94 is connected in parallel with the tank circuit as illustrated in FIG. 16. Therefore the Q of capacitor 207 affects the overall Q of the oscillator. Since in the circuit of FIG. 8 the load is in parallel with capacitor 209, the Q of this parallel combination is low and the overall Q of the circuit is somewhat reduced. This results in phase noise values that, while relatively low, are not low as those of the circuit of FIG. 2.

Figure 9:
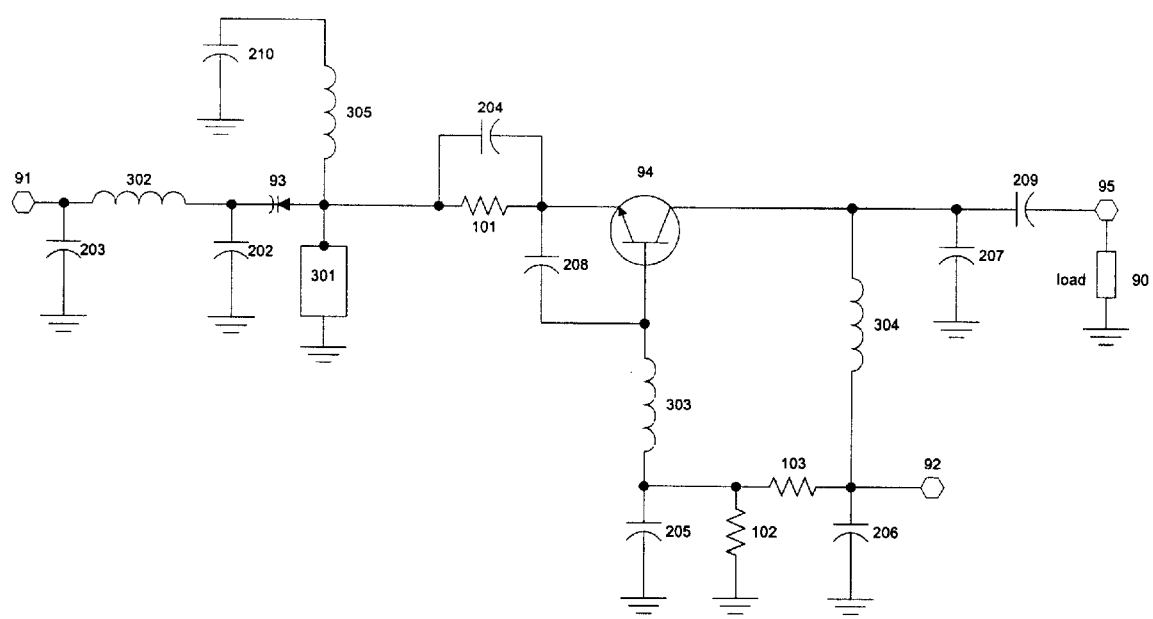
FIG. 9 illustrates the embodiment of FIG. 7 where an inductor is replaced by a microcircuit strip.

FIG. 9 is an embodiment of the invention that is essentially identical to that of FIG. 7. The difference is that the inductor 301 of FIG. 7 has been replaced with microstrip 301 of FIG. 9.

Figure 10:
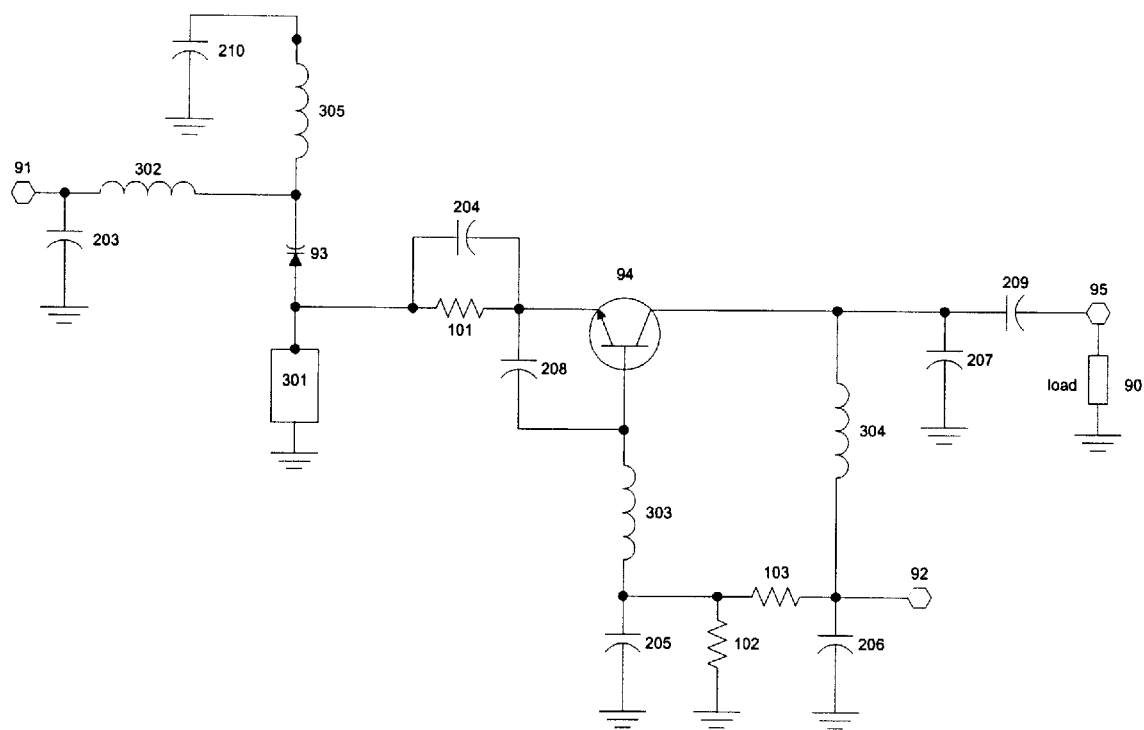
FIG. 10 illustrates the embodiment of FIG. 8 where an inductor is replaced by a microcircuit strip.

FIG. 10 is an embodiment of the invention which is essentially identical to that of FIG. 8. The difference is that the inductor 301 of FIG. 8 has been replaced with microstrip 301 of FIG. 10.

Figure 11:
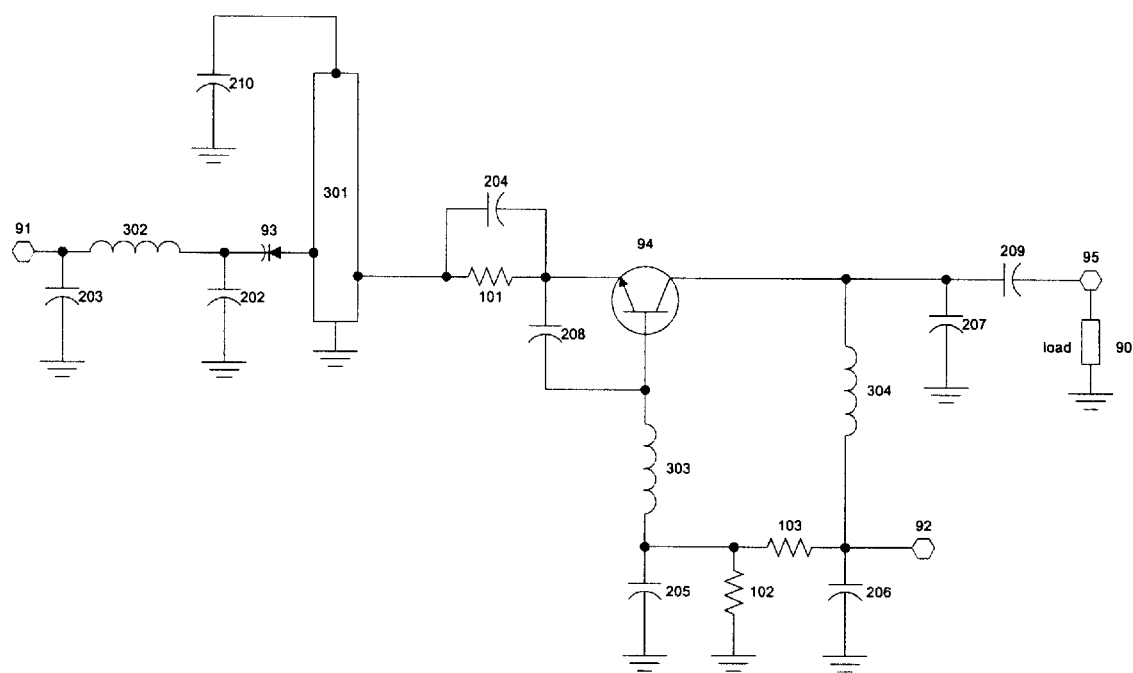
FIG. 11 illustrates the embodiment of FIG. 7 where two inductors are replaced by microcircuit strips.
Figure 12:
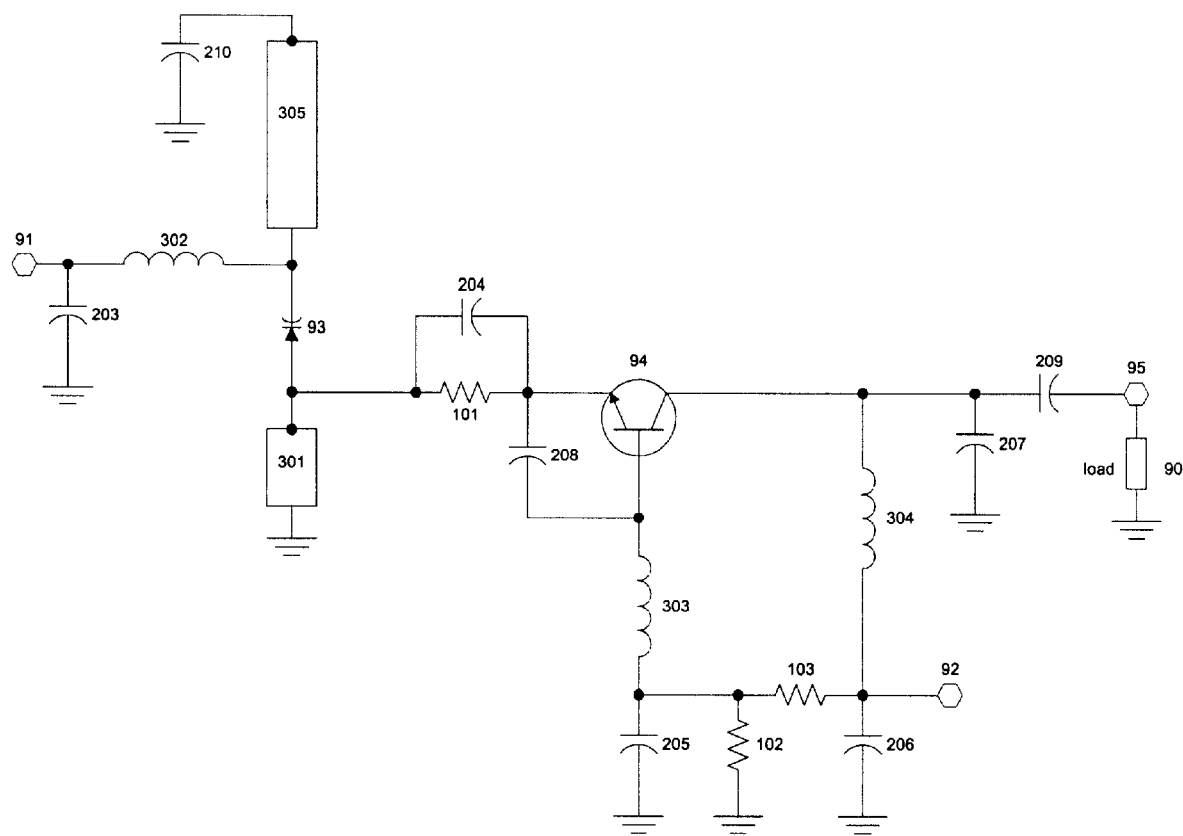
FIG. 12 illustrates the embodiment of FIG. 8 where two inductors are replaced by microcircuit strips.

FIG. 11 is an embodiment of the invention that is essentially identical to that of FIG. 7. The differences are:
3. Inductor 301 of FIG. 7 has been replaced with the segment of microstrip 301 of FIG. 11 located between the anode of varactor 93 and ground.
4. Inductor 305 of FIG. 7 has been replaced with the segment of microstrip 301 of FIG. 11 located between the anode of varactor 93 and capacitor 210.

FIG. 12 is an embodiment of the invention that is essentially identical to that of FIG. 8. The differences are:
3. Inductor 301 of FIG. 8 has been replaced with microstrip 301 of FIG. 12.
4. Inductor 305 of FIG. 8 has been replaced with microstrip 305 of FIG. 12.

The subject low phase noise oscillator is superior to the prior art oscillators because this circuit takes better advantage of the resonator's Q, that is, the loaded Q, $Q_L$ is closer to the unloaded Q, $Q_u$ as revealed through the following analysis.

Figure 17:
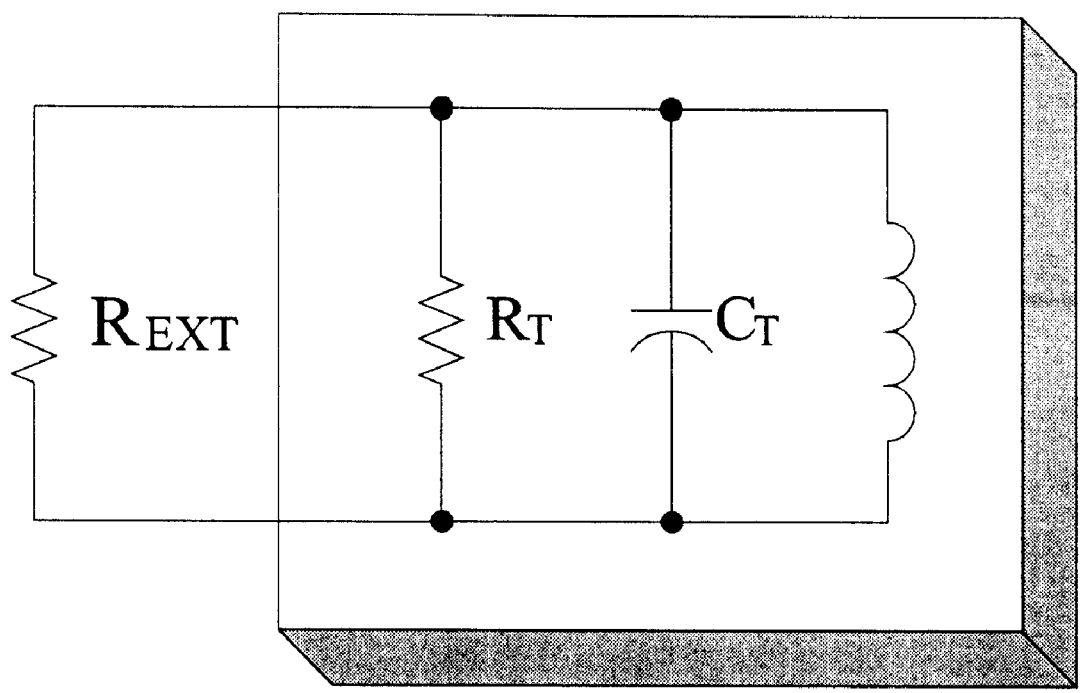
FIG. 17 is a schematic drawing showing an external resistor connected in parallel with the resonator. The resonator or tank circuit is shown enclosed in a box.

A parallel resonant circuit as shown in FIG. 17 can be reduced to three components: an inductor $L_T$, a capacitor $C_T$, and a resistor $R_T$, where $L_T$ represents the inductance of the inductor in the tank circuit $C_T$ represents the capacitance of the capacitor in the tank circuit and $R_T$ represents the inherent resistance in the tank circuit and takes into account the losses in both the capacitor and inductor. Therefore, $R_T$ does not correspond to a discrete circuit element. The resonance frequency is defined as the frequency is defined as the frequency at which the reactance of $L_T$ equals the reactance of $C_T$. From A.C. theory, we get respectively, equations two and three:

$$X_{LT} = 2\pi f L_T \quad X_{CT} = \frac{1}{2\pi C_T}$$

The resonant frequency, $f_0$, given by equation four, is therefore, $$f_0 = \frac{1}{2\pi\sqrt{L_T C_T}}$$

At resonance frequency, both the inductor $L_T$, and the capacitor $C_T$ have the same reactance which we call $X_0$, Q is defined by the following equation, equation five;

$$Q = \frac{R_T}{X_o}$$

Figure 18:
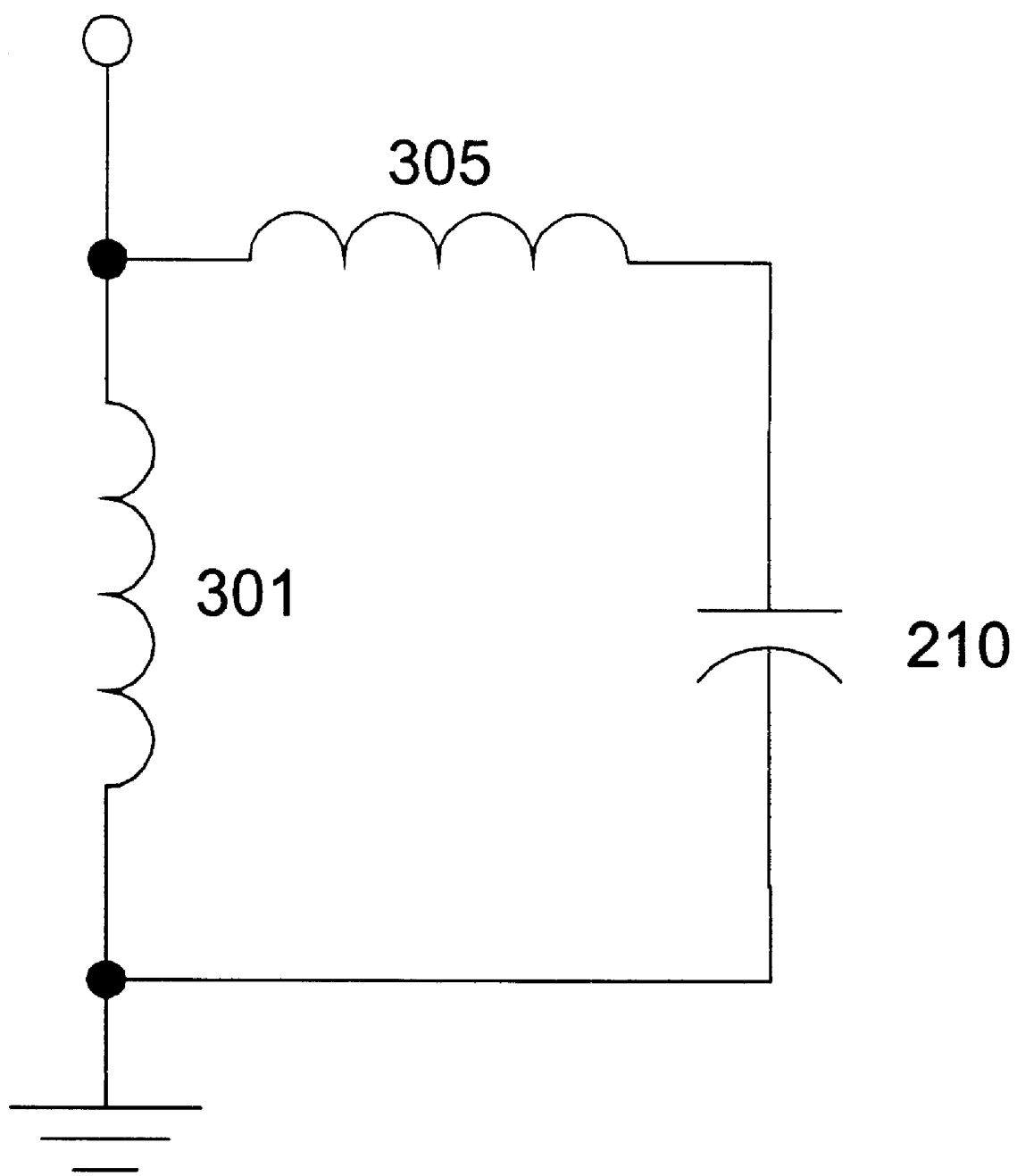
FIG. 18 is a schematic drawing illustrating configuration of the resonator of this invention.

Hence higher values of $R_T$, $X_0$ being constant result in higher values of Q. The parallel resonator's Q is affected by external loading. If an external resistor $R_{ext}$ is connected in parallel with the resonator, the resulting configuration is as illustrated in FIG. 18. The tank circuit is shown enclosed in a rectangular block. We define the unoaded Q, $Q_u$, as the intrinsic Q of the resonator which is given by the following equation, equation six;

$$Q_u = \frac{R_T}{X_0}$$

Because $R_T$ and $R_{EXT}$ are connected in parallel in FIG. 18, they result in an equivalent resistance, given by the following equation, equation seven;

$$R_{EQV} = \frac{1}{\frac{1}{R_{EXT}} + \frac{1}{R_T}}$$

The loaded Q, $Q_L$ is defined by equation eight as follows;

$$Q_L = \frac{R_{EQV}}{X_o}$$

In this invention $R_{EXT}$ represents the loading effect on the tank circuit due to the rest of the oscillator circuit and it is discussed in detail on U.S. Pat. No. 5,748,051, and incorporated herein by reference.

Comparing the values of $Q_u$ and $Q_L$ reveals that $Q_u \geq Q_L$ because the equivalent resistance of two resistors connected in parallel is always less than or equal to either of the two resistances (they are equal only in the case where $R_{EST}=00$.) Therefore we can conclude that the loaded $Q_u$ and $Q_L$ takes into account the effect of the resistance external to the resonator; that the loaded Q approaches its upper limit which is the unloaded Q or $Q_u$ as the value of the external resistor, $R_{EXT}$ approaches infinity; and that the loaded Q approaches it lower limit of zero as the value of the external resistor $R_{EXT}$ approaches zero.

The loaded Q as a function of $R_T$, $R_{EXT}$ and $Q_u$ is given by the following equation nine which is derived by dividing both sides of the equation eight by the corresponding sides of equation six and substituting the value $R_{EQV}$ given by equation seven, multiplying both sides of the resulting equation by $Q_u$ and simplifying $$Q_L = \frac{Q_U}{\left(1 + \frac{R_T}{R_{EXT}}\right)}$$

As shown above there are two ways of maximizing the loaded Q: One is to maximize $R_{EXT}$ while $R_T$ remains constant. This is the approach followed in U. S. Pat. No. 5,748,051, the substance of which is incorporated herein in its entirety. This is not feasible in some cases, leading to unpractical component values in the oscillator circuit. The other way to maximize the loaded Q of the resonator is to minimize $R_T$ without modifying $R_{EXT}$ which is the approach followed in the present invention. $R_T$ as a function of tank inductor value and capacitor value is given respectively.

$$R_T = 2\pi f_{L_T} Q_U \quad R_T = \frac{Q_U}{2\pi f_{C_T}}$$

Which are equations ten and eleven, respectively.

It follows from these equations that for a desired value of $Q_u$ the way to minimize $R_T$ is to choose a small value for $L_T$ which in turn results in a large value $C_T$. Although it is possible to make small value physical inductors having a high Q at UHF and microwave frequencies, it is not possible to have high value capacitors having a high Q at said frequencies. To illustrate this, consider that the Q of a premium grade porcelain chip capacitor of 20 picofarads at 1 Ghz is about 60. In contrast, the Q of a same grade, 1 picofarad capacitor at 1 Ghz is about 400. In this invention, the reactance of a low value capacitor is transformed through the use of an inductor into a small equivalent reactance that simulates or is equivalent to a large capacitor. This makes possible to utilize the high Q of the low value capacitor and at the same time obtain a low $R_T$ value that results in a high unloaded Q, and therefore, low phase noise.

Figure 19:
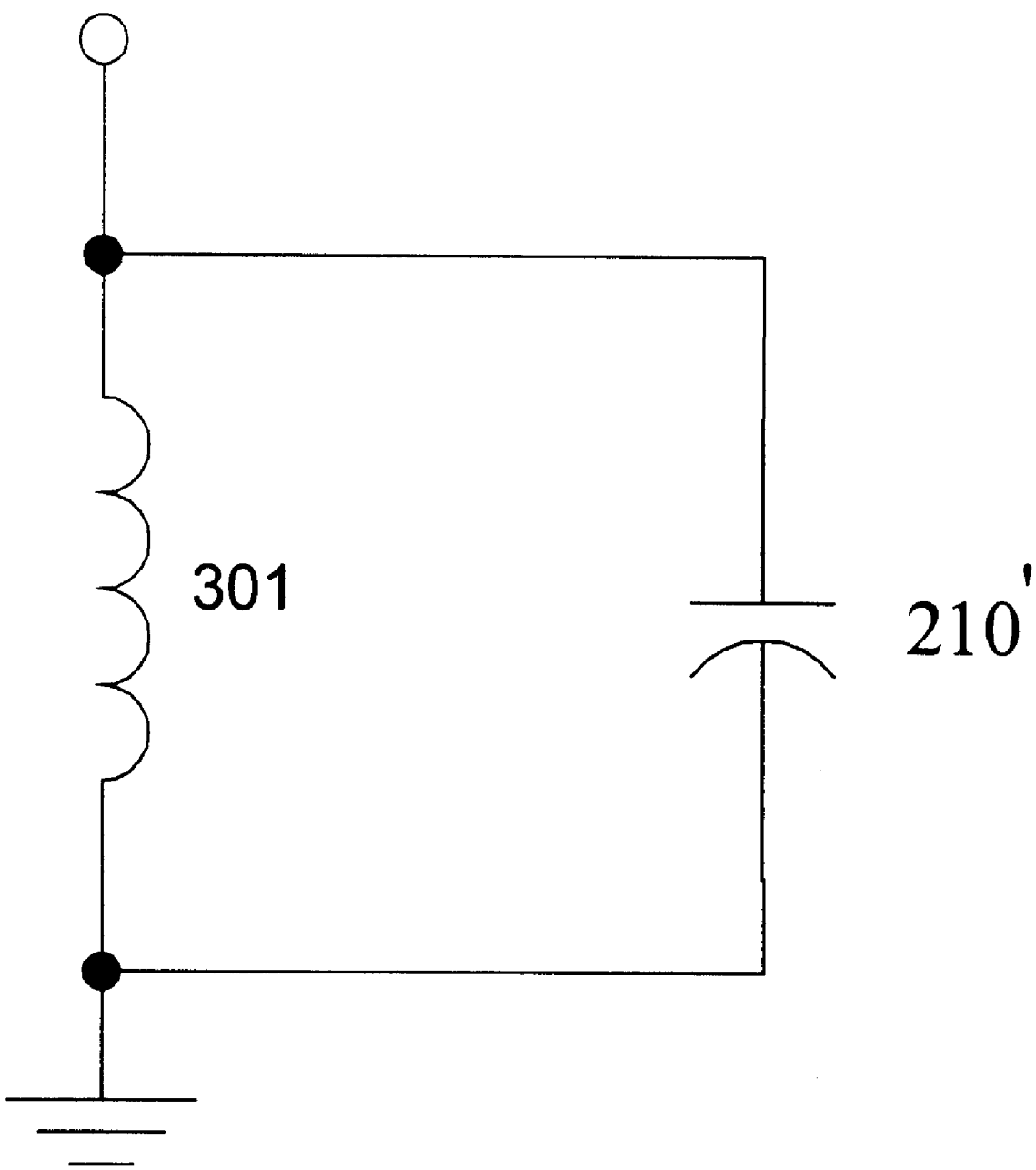
FIG. 19 is a schematic drawing illustrating the resonator of the invention reduced to two components.

FIG. 19 illustrates how in the present invention a low value capacitor 210 in series with an inductor 305 simulates a larger capacitor 210. At resonance, the following equations twelve and thirteen state that the reactance of 301 equals the reactance of the series combination of 305 and 210

$$2\pi f_0 L_{301} = \frac{1}{2\pi f_0 C_{EQV}} \quad 2\pi f_0 L_{301} = \frac{1}{2\pi f_0 C_{210}} - 2\pi f_0 L_{305}$$

and for solving for $L_{301}$ yields the following equation 14

$$L_{305} = \frac{1}{(2\pi f_0)^2 C_{210}} - L_{301}$$

The design procedure is: First, select an inductor 301 if a value low enough so that the loading effect of the rest of the oscillator circuit is acceptable. Second, select a capacitor 210 with a low value so that its Q is the desired value; and calculate the value of inductor 305 according to equation 13 so the tank circuit resonates at the desired frequency $f_0$. To illustrate that the series combination of inductor 305 and the capacitor 210 results in an equivalent capacitance having a high value, let's consider that at resonance the reactance of the said equivalent capacitance equals the reactance of inductor 301 as shown by the following equation, equation fifteen;

$$2\pi f_0 L_{301} = \frac{1}{2\pi f_0 C_{EQV}}$$

which results in equation sixteen below;

$$C_{EQV} = \frac{1}{(2\pi f_0)^2 L_{301}}$$

Therefore, low values of the inductance of inductor 301 result in high values of the equivalent capacitance of the series combination of inductor 305 and capacitor and capacitor 210.

It will be apparent to those skilled in the art that various modifications and variations can be made in the oscillator circuit of the invention without departing from the spirit of scope thereof. Therefore, it is intended that the present invention cover the modifications and variations of the invention provided that they come within the scope of the appended claims and their equivalents.

What is claimed is:

1. An oscillator circuit exhibiting low phase noise characteristics comprising:
   a transistor having a collector, an emitter and a base;
   a first capacitor connected between the collector of the transistor and a common potential;
   a first inductor having a first terminal and a second terminal, said first terminal connected to the junction between the first capacitor and the collector;
   a second capacitor connected on one side to the second terminal of the first inductor and on the other side to a common potential;
   a first resistor having a first terminal and a second terminal, said first terminal being connected to the junction between the first inductor and the second capacitor;
   a second resistor connected between the second terminal of the first resistor and a common potential;
   a third capacitor connected between a common potential and the junction formed by the first resistor and the second resistor;

a D.C. supply voltage terminal connected to the junction formed by the first inductor, the second capacitor and the first resistor;

a fourth capacitor having a first and second terminal, the first terminal being connected to the junction formed by the first resistor, the second resistor and the third capacitor and the second terminal being connected to the load input which will receive the oscillating signal;

a second inductor having a first terminal and a second terminal, the first terminal being connected between the junction formed by the first resistor, the second resistor, the third capacitor and the fourth capacitor and the second terminal of the second inductor being connected to the base of the transistor;

a fifth capacitor connected between the junction formed by the base and the second inductor and the emitter of the transistor;

a sixth capacitor having a first plate and a second plate, the first plate being connected to the junction formed by the emitter of the transistor and the fifth capacitor;

a third resistor provided with a first and a second terminal, the first terminal of the third resistor being connected to the junction of the emitter of the transistor, the fifth capacitor and the first plate of the sixth capacitor, and the second terminal of the third resistor being connected to the second plate of the sixth capacitor; and a parallel resonant circuit having very low inductive and capacitive reactances and connected to the junction between the second terminal of the third resistor and the sixth capacitor; and said parallel resonant circuit comprising a third and a fourth inductor and a seventh capacitor, both of said inductors being connected at one of their respective ends to said junction between the third resistor and the sixth capacitor, the other end of the third inductor being connected to a common ground and the other end of the fourth inductor being connected in series through said seventh capacitor to a common ground.

2. The oscillator circuit of claim 1 wherein said third inductor has a value of less than one nanohenry.

3. The oscillator circuit of claim 1 wherein said third inductor is a microstrip.

4. The oscillator circuit of claim 1 wherein said fourth inductor is a microstrip.

5. The oscillator circuit of claim 1 wherein both of said third and fourth inductors are microstrips.

6. The oscillator circuit of claim 1 further including voltage control circuitry enabling the oscillation frequency to be controlled by an applied voltage, said voltage control circuitry comprising:

a varactor provided with a first and a second terminal, the first terminal of the varactor being the anode and the second terminal being the cathode, the first terminal of the varactor being connected between the junction formed by the second plate of the sixth capacitor, the second terminal of the third resistor, the third inductance and the seventh capacitor;

an eight capacitor connected between the second terminal of the varactor and a common potential;

a fourth inductor having a first and a second terminal, the first terminal of which is connected between the junction formed by the second terminal of the varactor and the eight capacitor;

a ninth capacitor connected between the second terminal of the fourth capacitor and a common potential; and a varactor control terminal connected to the junction of the second terminal of the fourth inductor and the ninth capacitor.

7. The oscillator circuit of claim 1 wherein the first terminal of said fourth capacitor is connected to the junction of said first inductor and said first capacitor and the second terminal of the forth capacitor is connected to a load input for receiving the oscillating signal.

8. The oscillator circuit of claim 6 wherein said third inductor is a microstrip.

9. The oscillator circuit of claim 7 wherein said fourth inductor is a microstrip.

10. The oscillator circuit of claim 8 wherein both of said third and fourth inductors are microstrips.

11. The oscillator circuit of claim 9 further including voltage control circuitry enabling the oscillation frequency to be controlled by an applied voltage, said voltage control circuitry comprising:

a varactor provided with a first and a second terminal, the first terminal of the varactor being the anode and the second terminal being the cathode, the first terminal of the varactor being connected between the junction formed by the second plate of the sixth capacitor, the second terminal of the third resistor, the third inductance and the seventh capacitor;

an eight capacitor connected between the second terminal of the varactor and a common potential;

a fourth inductor having a first and a second terminal, the first terminal of which is connected between the junction formed by the second terminal of the varactor and the eight capacitor;

a ninth capacitor connected between the second terminal of the fourth capacitor and a common potential; and a varactor control terminal connected to the junction of the second terminal of the fourth inductor and the ninth capacitor.

12. The oscillator circuit of claim 1 wherein said parallel resonant circuit is a microstrip having one end connected to a first common ground and the other end is connected through a seventh capacitor to a second common ground, said microstrip having a first tap connected at said junction between the second terminal of the third resistor and the sixth capacitor and a second tap connected to a voltage control circuit.

13. An oscillator circuit exhibiting low phase noise characteristics comprising:

a transistor having a collector, an emitter and a base;

a first capacitor connected between the collector of the transistor and a common potential;

a first inductor having a first terminal and a second terminal, said first terminal connected to the junction between the first capacitor and the collector;

a second capacitor connected on one side to the second terminal of the first inductor and on the other side to a common potential;

a first resistor having a first terminal and a second terminal, said first terminal being connected to the junction between the first inductor and the second capacitor;

a second resistor connected between the second terminal of the first resistor and a common potential;

a third capacitor connected between a common potential and the junction formed by the first resistor and the second resistor;

a D.C. supply voltage terminal connected to the junction formed by the first inductor, the second capacitor and the first resistor;

a fourth capacitor having a first and second terminal, the first terminal being connected to the junction formed by the first resistor, the second resistor and the third capacitor and the second terminal being connected to the load input which will receive the oscillating signal;

a second inductor having a first terminal and a second terminal, the first terminal being connected between the junction formed by the first resistor, the second resistor, the third capacitor and the fourth capacitor and the second terminal of the second inductor being connected to the base of the transistor;

a fifth capacitor connected between the junction formed by the base and the second inductor and the emitter of the transistor;

a sixth capacitor having a first plate and a second plate, the first plate being connected to the junction formed by the emitter of the transistor and the fifth capacitor;

a third resistor provided with a first and a second terminal, the first terminal of the third resistor being connected to the junction of the emitter of the transistor, the fifth capacitor and the first plate of the sixth capacitor, and the second terminal of the third resistor being connected to the second plate of the sixth capacitor; and a parallel resonant circuit having very low inductive and capacitive reactances and connected to the junction between the second terminal of the third resistor and the sixth capacitor, said parallel resonant circuit comprising third and fourth inductors and a seventh capacitor, both of said inductors being connected at one of their negative ends to said junction between the third resistor and sixth capacitor the other end of the third inductor being connected to a common ground and the other end of the fourth inductor being connected in series through the seventh capacitor to a common ground.

14. The oscillator circuit of claim 12 wherein said third inductor is a microstrip.

15. The oscillator circuit of claim 12 wherein said fourth inductor is a microstrip.

16. The oscillator circuit of claim 12 wherein both of said third and fourth inductors are microstrips.

17. The oscillator circuit of claim 12 further including voltage control circuitry enabling the oscillation frequency to be controlled by an applied voltage, said voltage control circuitry comprising:

a varactor provided with a first and a second terminal, the first terminal of the varactor being the anode and the second terminal being the cathode, the first terminal of the varactor being connected between the junction formed by the second plate of the sixth capacitor, the second terminal of the third resistor, the third inductance and the seventh capacitor;

an eight capacitor connected between the second terminal of the varactor and a common potential;

a fourth inductor having a first and a second terminal, the first terminal of which is connected between the junction formed by the second terminal of the varactor and the eight capacitor;

a ninth capacitor connected between the second terminal of the fourth capacitor and a common potential; and a varactor control terminal connected to the junction of the second terminal of the fourth inductor and the ninth capacitor.

18. The oscillator circuit of claim 12 wherein the first terminal of said fourth capacitor is connected to the junction of said first inductor and said first capacitor and the second terminal of the fourth capacitor is connected to a load input for receiving the oscillating signal.

19. The oscillator circuit of claim 17 wherein said third inductor is a microstrip.

20. The oscillator circuit of claim 17 wherein said fourth inductor is a microstrip.

21. The oscillator circuit of claim 18 wherein said fourth inductor is a microstrip.

22. The oscillator circuit of claim 9 further including voltage control circuitry enabling the oscillation frequency to be controlled by an applied voltage, said voltage control circuitry comprising:

a varactor provided with a first and a second terminal, the first terminal of the varactor being the anode and the second terminal being the cathode, the first terminal of the varactor being connected between the junction formed by the second plate of the sixth capacitor, the second terminal of the third resistor, the third inductance and the seventh capacitor;

an eight capacitor connected between the second terminal of the varactor and a common potential;

a fourth inductor having a first and a second terminal, the first terminal of which is connected between the junction formed by the second terminal of the varactor and the eight capacitor;

a ninth capacitor connected between the second terminal of the fourth capacitor and a common potential; and a varactor control terminal connected to the junction of the second terminal of the fourth inductor and the ninth capacitor.

23. The oscillator circuit of claim 12 wherein said parallel resonant circuit is a microstrip having one end connected to a first common ground and the other end is connected through a seventh capacitor to a second common ground, said microstrip having a first tap connected at said junction between the second terminal of the third resistor and the sixth capacitor and a second tap connected to a voltage control circuit.

* * * * *